(12) United States Patent
Corderman et al.

(10) Patent No.: US 7,488,671 B2
(45) Date of Patent: Feb. 10, 2009

(54) NANOSTRUCTURE ARRAYS AND METHODS OF MAKING SAME

(75) Inventors: Reed Roeder Corderman, Niskayuna, NY (US); Anthony Yu-Chung Ku, Rexford, NY (US)

(73) Assignee: General Electric Company, Schenectady, NY (US)

( * ) Notice: Subject to any disclaimer, the term of this patent is extended or adjusted under 35 U.S.C. 154(b) by 190 days.

(21) Appl. No.: 11/441,581

(22) Filed: May 26, 2006

(65) Prior Publication Data

US 2007/0275499 A1 Nov. 29, 2007

(51) Int. Cl.
*H01L 21/20* (2006.01)
*H01L 21/36* (2006.01)

(52) U.S. Cl. .............. 438/479; 438/478; 438/400; 438/445; 438/448; 438/551; 257/E29.001; 257/E51.001; 977/700

(58) Field of Classification Search .......... 438/479, 438/400, 441, 445, 448, 551; 977/700; 257/E29.001, 257/E51.001
See application file for complete search history.

(56) References Cited

U.S. PATENT DOCUMENTS

| | | | |
|---|---|---|---|
| 6,803,840 B2 | 10/2004 | Hunt et al. | |
| 2002/0055239 A1* | 5/2002 | Tuominen et al. | 438/466 |
| 2004/0056271 A1 | 3/2004 | Chen et al. | |
| 2004/0131937 A1 | 7/2004 | Chen et al. | |
| 2004/0144985 A1* | 7/2004 | Zhang et al. | 257/79 |
| 2004/0265212 A1 | 12/2004 | Varadhan et al. | |
| 2005/0012975 A1 | 1/2005 | George et al. | |
| 2005/0285116 A1 | 12/2005 | Wang | |
| 2006/0275955 A1* | 12/2006 | Ku et al. | 438/128 |

* cited by examiner

*Primary Examiner*—Walter L Lindsay, Jr.
*Assistant Examiner*—Abdulfattah Mustapha
(74) *Attorney, Agent, or Firm*—Fletcher Yoder (57) ABSTRACT

A method of making a nanostructure array including disposing a masking material on a nanoporous template such that a first number of the plurality of nanopores are fully coated while a second number of the plurality of nanopores are not-fully coated by the masking material is provided. The method includes forming the nanostructures within the plurality of nanopores that are not-fully coated by the masking material. A nanostructure array fabricated in accordance to above said method and devices based on the nanostructure array is also provided.

18 Claims, 4 Drawing Sheets

NANOSTRUCTURE ARRAYS AND METHODS OF MAKING SAME

BACKGROUND

The invention relates generally to nanostructure arrays, and more specifically to nanorod arrays.

Nanotechnology is becoming increasingly important as a basis for the fabrication of various devices. Nanostructures, such as nanorods, nanoparticles, nanowires and nanotubes, may be employed in many integrated circuits. Nanostructure-based devices are generally characterized by dramatically reduced power and mass, while simultaneously having enhanced capabilities. One such device that may employ nanotechnology is a field emitting device which may include a field emitting assembly having a cathode and a nanostructure array. To a large extent, the efficiency of the field emitting device is dependent on the design of the nanostructure array.

Nanostructure arrays may be fabricated through electrodeposition into porous templates. For example, metal nanorods may be formed by electrodeposition in the pores of an anodic aluminum oxide (AAO) template. In these cases, the spacing between the nanorods, or the "pitch" of the nanorods, is determined by the pitch of the pores in the template. The pitch of the pores in the AAO template may depend on the conditions during anodization such as, choice of the electrolytes as well as the voltage applied during anodization. In effect, the pitch of the nanorods may be controlled by varying the conditions under which the pores are formed in the AAO template. However, suitable combinations of electrolyte and voltage for achieving pitch greater than about 1 micrometer are not known.

Accordingly, it may be advantageous to fabricate large area nanostructure arrays with large pitch in a controlled manner.

BRIEF DESCRIPTION

In accordance with an embodiment of the present invention, a method of making a nanostructure array is provided. The method includes disposing a masking material on a template comprising a plurality of nanopores such that a first number of the plurality of nanopores are fully coated by the masking material and a second number of the plurality of nanopores are not-fully coated by the masking material. The method further includes forming a plurality of nanostructures in only the second number of the plurality of nanopores.

In another embodiment of the present invention, a method of making a nanostructure array is provided. The method includes providing a template comprising a plurality of nanopores. The method further includes disposing a masking material in only a portion of the plurality of nanopores to form a plurality of masked nanopores and a plurality of unmasked nanopores, wherein a distribution of the plurality of masked nanopores and the plurality of unmasked nanopores is substantially random. The method further includes forming a plurality of nanostructures in the plurality of unmasked nanopores.

In yet another embodiment of the present invention, a method of making a nanostructure array including providing an anodic aluminum oxide template comprising a plurality of nanopores is provided. The method further includes disposing a masking material on the anodic aluminum oxide template to form a plurality of masked nanopores and a plurality of unmasked nanopores, wherein the masking material includes silanes. The method further includes electrodepositing in the plurality of unmasked nanopores to form a plurality of nanostructures comprising a pitch.

According to embodiments of the present invention, a nanostructure array including a substrate supported template having a plurality of nanopores is provided. The nanostructure array further includes a masking material disposed on the template to form a plurality of masked nanopores and a plurality of unmasked nanopores. The nanostructure array further includes a plurality of nanostructures in the plurality of unmasked nanopores.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

A nanostructure array fabricated on a nanoporous template may have a pitch between each of the nanostructures that may depend on a pitch of the nanopores of the template. In commonly used templates such as, anodic aluminum oxide, the typical pitch of the nanopores is in a range of about 50 nanometer (nm) to about 500 nm. Accordingly, the pitch between each of the nanostructures in the anodic aluminum oxide template may be of similar range as the pitch of the nanopores. For applications involving field emission it is desirable to have a larger pitch. A large pitch between each of the nanostructures may reduce the screening effects due to neighboring nanostructures and may in turn increase the enhancement in the electric field obtained by using a structure with nanometer dimension. Also, it may be desirable to demonstrate a viable method for fabrication of large area nanostructure array. As described further below, embodiments of the present invention provide improved methods for fabricating nanostructure arrays and devices incorporating the same.

A "nanostructure", as used herein, is a structure being of nanometer size in at least one dimension. Exemplary nanostructures include, but are not limited to, nanoparticles, nanotubes, nanorods, nanowires, and the like. Generally, nanometer size is less than about 1 micrometer, and typically nanometer size is less than about 100 nanometers.

Figure 1:
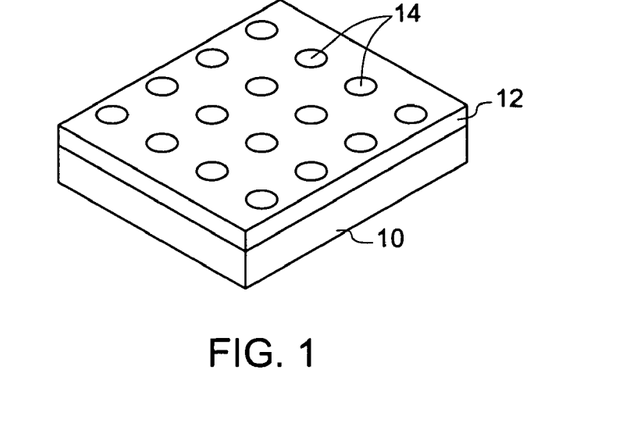
FIGS. 1-3 are perspective views illustrating a process for forming a nanostructure array, in accordance with exemplary embodiments of the present invention.
Figure 2:
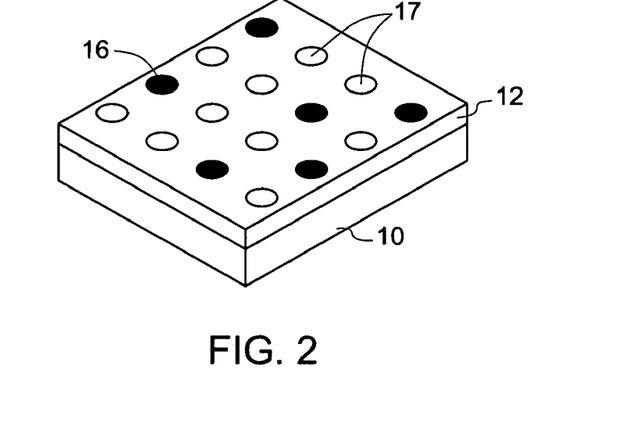
Figure 3:
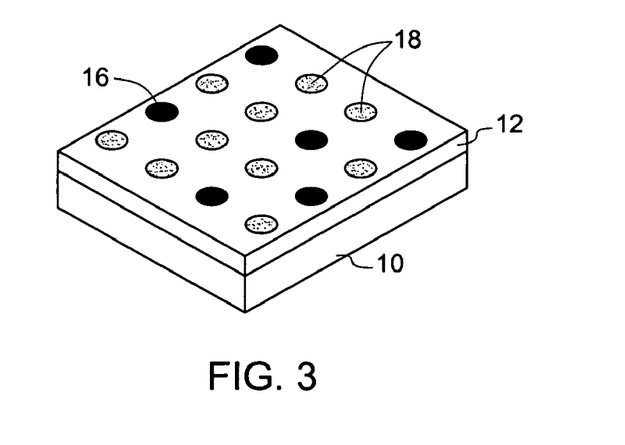

Turning now to the figures, FIGS. 1-3 illustrate an exemplary process for fabricating a nanostructure array, according to exemplary embodiments of the present invention. Specifically, FIG. 1 is a perspective view of a template 12 disposed on a substrate 10. The substrate 10 may be a material such as semiconductor, glass, molecular solid, metal, ceramic, polymer, or any combination thereof. Exemplary substrate materials include silicon, silicon carbide, or gallium nitride, for example. In some embodiments, the substrate 10 is substantially smooth. As used herein "substantially smooth" refers to a surface smoothness sufficient to allow for reflection of light off the surface.

Further, the substrate 10 may include sub layers (not shown). Exemplary sub layers may include an adhesive layer to improve the adhesion between the substrate 10 and the overlying template 12. Other exemplary sub layers include a semiconductor layer, a metal layer, or an insulating layer.

As illustrated in FIG. 1, the template 12 may include a plurality of nanopores 14. As used herein, "nanopores" refers to pores, having a pore diameter of less than about one micrometer. As used herein, the "template" 12 including the plurality of nanopores 14 is also referred to as a "nanoporous template".

In one embodiment, the template 12 is of anodized aluminum oxide. Exemplary nanoporous template materials include, but are not limited to, titanium oxide, porous silicon, nanoporous glass, track etched mica, track etched polyester, track etched polycarbonate, track etched polymer materials, or any combination thereof.

The plurality of nanopores 14 may be arranged uniformly in the template 12. In certain embodiments, the plurality of nanopores 14 is arranged substantially perpendicular to a plane of the template 12. In certain other embodiments, for example, employing a 10×10 micrometer track etched polymer template, the plurality of nanopores 14 may not be uniformly arranged. In some embodiments, the nanopores may extend across the template 12 along a direction perpendicular to the plane of the template 12, such that a portion of the substrate 10 is exposed through the plurality of nanopores 14. Alternatively, the plurality of nanopores 14 may extend just above the substrate 10. Typically, a density of the plurality of nanopores 14 in the template 12 is in a range of about $10^9$ pores per square centimeter to about $10^{12}$ pores per square centimeter, although templates 12 of differing density may be used. As illustrated in FIG. 1, the plurality of nanopores 14 is spaced at a distance from each other. In one embodiment, a pitch between each of the plurality of nanopores is in a range of about 60 nm to about 500 nm. As used herein, "pitch of the nanopores" refers to a distance between a center of one nanopore to a center of a neighboring nanopore.

A masking material is disposed non-uniformly in the plurality of nanopores 14 to form a plurality of fully coated nanopores 16, as illustrated in FIG. 2. The term "non-uniformly" as used herein, refers to an incomplete process and/or a random nature of the process. As illustrated in FIG. 2, the masking material fully coats a first number of the plurality of nanopores 14 to form the plurality of fully coated nanopores 16, while a second number of the plurality of nanopores 14 are not-fully coated or are partially coated, thereby providing a plurality of non-fully coated nanopores 17. The term "fully coated" as used herein, refers to a condition wherein the masking material covers the sidewalls of the nanopores. The term may also refer to the condition where the masking material fills the nanopores. As will be appreciated, the plurality of nanopores that are fully coated and/or filled with the masking material (here the plurality of fully coated nanopores 16) may prevent the formation of nanostructures in the plurality of nanopores. As used herein, the "plurality of fully coated nanopores" is also referred to as a "plurality of masked nanopores", and the "plurality of non-fully coated nanopores" is also referred to as a "plurality of unmasked nanopores", respectively. In other words, by non-uniformly coating the template using the masking material, a plurality of masked nanopores 16 and a plurality of unmasked nanopores 17, as shown in FIG. 2, are formed.

According to embodiments of the present invention, when the coating is non-uniform, a distribution of the plurality of masked nanopores 16 and the plurality of unmasked nanopores 17 is substantially random. As used herein, the term "substantially random" indicates that there is no discernible pattern or order in the distribution of the plurality of masked nanopores 16, and the plurality of unmasked nanopores 17. To illustrate further, on random distribution, it may not be possible to control precisely which of the individual nanopores may be fully coated or not-fully coated with the masking material. However, a number of the plurality of fully coated nanopores 16 and a number of the plurality of nanopores that are not-fully coated 17 (i.e., the percentage of fully coated nanopores 16) may be controlled by varying certain parameters during coating, as will be described further below with respect to FIG. 4.

Further, the non-uniform coating of the template 12 with the masking material may be quantified in terms of a defect density. As used herein, the term "defects" may be correlated to a number of the plurality of nanopores 14 that are fully coated by the masking material by non-uniform coating. The defect density may be defined as the number of defects per unit area of the template 12. The defect density may be correlated to the number of the plurality of masked nanopores 16 per unit area of the template 12. According to embodiments of the present invention, the defect density may be controlled by varying the conditions during the non-uniform coating process. Exemplary conditions that may be varied include, but are not limited to, a choice of the masking material and a period of time for which the template 12 is exposed to the masking material.

In certain embodiments, the masking material is a hydrophobic material. Advantageously, the hydrophobic nature of the masking material may prevent deposition of a hydrophilic material in the plurality of fully coated nanopores 16. For example, during electrodeposition of a material in a hydrophilic medium, the hydrophilic medium may not wet the plurality of fully coated nanopores 16 to electrodeposit the material. In some embodiments, the masking material may comprise a photosensitive material. Exemplary photosensitive materials include alkylsilanes, alkylsilane coated titania particles or any combinations thereof. In certain embodiments, the photosensitive material may form a self-assembled monolayer (SAM) on a surface of the template 12 to form the plurality of fully coated nanopores 16.

Exemplary masking materials include, but are not limited to silanes, silane coated titania particles, thiols, or polymers. Examples of silanes include alkyl silanes such as, monosilanes, trichlorosilanes, dichlorosilanes, monochlorosilanes, octadecyl trichlorosilane, trimethoxy silanes, dimethoxysilanes, monomethoxysilanes, triethoxysilanes, diethoxysilanes, monoethoxysilanes, or any combinations thereof.

Following the formation of the plurality of fully coated nanopores 16, a plurality of nanostructures 18 may be formed, as illustrated in FIG. 3. The plurality of nanostructures 18 may be formed within the plurality of nanopores 17 that are not-fully coated with the masking material. The plurality of nanostructures 18 may be a nanoparticle, a nanowire, a nanorod, a nanotube, or any combinations thereof. In one embodiment, the plurality of nanostructures 18 is well within the plurality of unmasked nanopores 17 of the template 12. In certain embodiments, the plurality of nanostructures 18 is grown from the plurality of unmasked nanopores 17 to about or above the plane of the template 12.

The materials that constitutes the plurality of nanostructures 18, include, but are not limited to, metals, thermoelectric materials, oxides, carbides, suicides, nitrides, conductive polymers, semiconductors, and the like. Further, the plurality of nanostructures 18 may be a catalytic material, an electrical conductor, a thermal conductor, a magnetic material, or any combinations thereof. In other words, using embodiments of the present invention, a plurality of nanostructures 18 of a desired chemical composition, and/or properties may be formed.

In some embodiments, the nanostructures 18 have a diameter in the range of about 10 nanometers to about 200 nanometers. In certain embodiments, the nanostructures 18 have a height of about 20 nanometers to about 20 micrometers.

A distance or pitch between each of the plurality of nanostructures 18 is variable, according to embodiments of the present invention. The "pitch of the nanostructures", as used herein, refers to a distance between a center of the nanostructure to a center of a neighboring nanostructure. As used herein, the term "variable" with respect to the pitch refers to a tunable pitch. For example, the pitch between each of the plurality of nanostructures 18 may be tuned from about 1 micrometer to about 1000 micrometers. The pitch between each of the plurality of nanostructures 18 is varied or tuned by controlling the conditions during the growth of the plurality of nanostructures 18. In some embodiments, the pitch between each of the plurality of nanostructures 18 is greater than about 1 micrometer. In certain embodiments, the pitch between each of the plurality of nanostructures 18 is in a range of about 1 micrometer to about 1000 micrometers. In certain other embodiments, the pitch between each of the plurality of nanostructures 18 is in a range of about 1 micrometer to about 100 micrometers.

Figure 4:
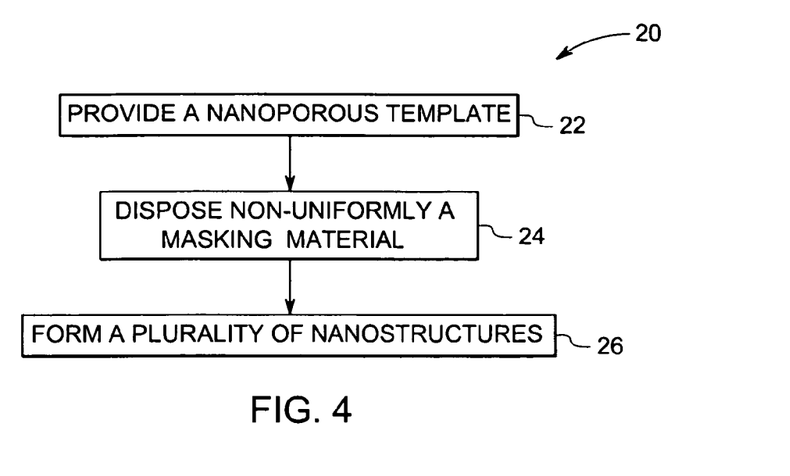
FIG. 4 is a flow chart illustrating a method of fabricating a nanostructure array in accordance with embodiments of the present invention illustrated in FIGS. 1-3.

Turning now to FIG. 4, a flow chart depicting the method of forming the nanostructure array, according to the embodiments illustrated in FIGS. 1-3, is provided and generally designated by the reference numeral 20. At step 22, a nanoporous template is provided. The nanoporous template is similar to the template described previously with reference to FIG. 1. The nanoporous template includes a plurality of nanopores that are arranged uniformly, and are perpendicular to the plane of the nanoporous template, in one embodiment.

A masking material is disposed non-uniformly on the nanoporous template, at step 24. The masking material may randomly coat the plurality of nanopores to form a plurality of masked nanopores and a plurality of unmasked nanopores. As described previously, the random masking may be defined in terms of a defect, where the defect may be correlated to the plurality of nanopores that are fully coated with the masking material. According to embodiments of the present invention, the number of defects per unit area of the template or a defect density may be controlled by varying the conditions during the random masking. Such conditions may include, a choice of the masking material and a period of time for which the template is exposed to the masking material. For example, a masking material that may not adhere easily to the template may lower the defect density as compared to a material that may adhere easily to the template by chemical means and/or by physical means. Accordingly, the defect density may be lowered by decreasing the time of exposure of the template to the masking material. In one embodiment, the nanoporous template is soaked in the masking material for a period of time of about 1 minute to about 48 hours, and the corresponding defect density is less than about 1%, or in a range of about 1% to about 95%. Exemplary conditions include a concentration of the masking material, and in some embodiments, the concentration of the masking material is in a range of about 10 millimolar (mM) to about 1 molar (M).

At step 26, a plurality of nanostructures is formed in the plurality of nanopores that are not-fully coated with the masking material. The formation of the plurality of nanostructures may be through techniques known in the art. In some embodiments, the plurality of nanostructures is formed by electrodepositing a material within the plurality of nanopores. The electrodeposition may involve exposing the plurality of nanopores to a precursor solution containing the material that is to be electrodeposited. In some embodiments, the precursor solution is hydrophilic in nature. As will be appreciated, the plurality of nanopores that are fully coated with the masking material comprising a hydrophobic material are not wetted by the precursor solution comprising a hydrophilic material. In other words, the plurality of nanostructures is selectively formed in the plurality of unmasked nanopores.

According to embodiments of the present invention, the plurality of nanostructures is selectively formed in the plurality of nanopores that are not-fully coated with the masking material and hence a pitch between each of the plurality of nanostructures may be controlled. In other words, the pitch between each of the plurality of nanostructures may be variable. The pitch between each of the plurality of nanostructures may depend on factors such as, choice of the template, choice of the masking material, conditions during the formation of unmasked nanopores, and conditions during the nanostructure growth. By varying each of the factors either independently or dependently of each other, the pitch between each of the plurality of nanostructures may be tuned. For example, the defect density, which corresponds to the plurality of masked nanopores, is proportional to the pitch between each of the plurality of nanostructures. In other words, the factors that may affect the defect density may also dictate the pitch between each of the plurality of nanostructures. The conditions during the nanostructure growth that may affect the pitch include a temperature at which nanostructures are deposited. In some embodiments, the nanostructures may be electrochemically deposited at a temperature in a range from about 5 degrees Celsius (° C.) to about 80° C. It should be understood that the choice of the template may also include conditions that may affect the growth of the nanopores in the template as these conditions may affect the pitch between each of the plurality of nanostructures.

Following the formation of the plurality of nanostructures in the plurality of nanopores of the template, optionally, the template may be removed such that only the plurality of nanostructures remain on the substrate. In one embodiment, the template comprising anodic aluminum oxide is dissolved in either phosphoric acid or sodium hydroxide or potassium hydroxide at room temperature to form a freestanding nanostructure array on the substrate.

Figure 5:
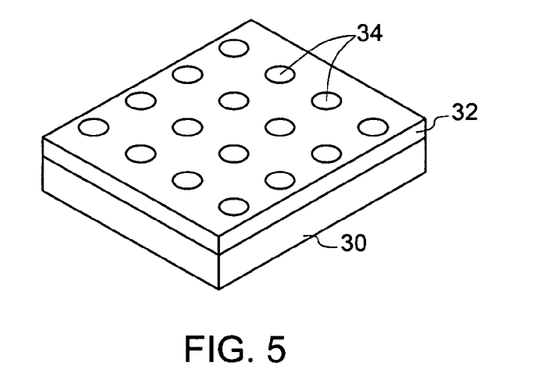
FIGS. 5-9 are perspective views illustrating a process for forming a nanostructure array, in accordance with further exemplary embodiments of the present invention.

Turning again to the figures, FIGS. 5-9 illustrate an exemplary process for fabricating a nanostructure array, according to further exemplary embodiments of the present invention. As will be described, the exemplary embodiments illustrated with reference to FIGS. 5-9 include employing a patterned mask, in addition to the masking material previously described, in fabricating a nanostructure array. Specifically, FIG. 5 is a perspective view of a template 32 disposed on a substrate 30. The substrate 30 and the template 32 are similar to the substrate 10 and the template 12, respectively, and have been described previously with respect to FIG. 1. The template 32 includes a plurality of nanopores 34, as illustrated in the figure.

Figure 6:
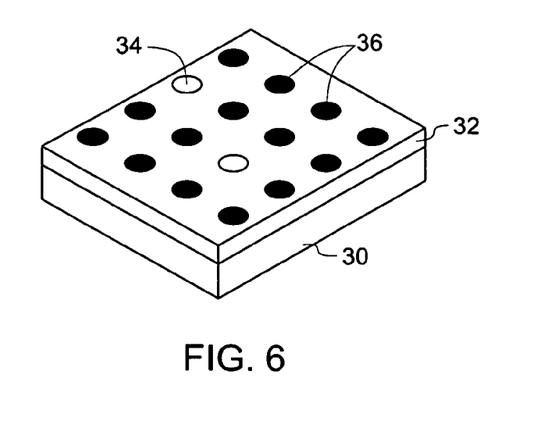

In the present exemplary embodiment, a masking material is disposed on the plurality of nanopores 34 to form a plurality of fully coated nanopores 36, as illustrated in FIG. 6. In some embodiments, the masking material may uniformly coat all of the plurality of nanopores 34. In certain embodiments, the percentage of masking may be in a range of about 30% to about 100%. As will be appreciated, regardless of the extent of masking, using a patterned mask may provide additional control for tuning the pitch of a nanostructure array. The formation of the plurality of fully coated nanopores 36 may be better described in terms of a defect density. As described previously, the defect density may be correlated to a number of the plurality of fully coated nanopores 36 per unit area of the template 32.

In one embodiment, the masking material is a photosensitive material. Example masking materials include alkylsilanes, alkylsilane coated titania particles or any combinations thereof. In some embodiments, the photosensitive material may form a self-assembled monolayer uniformly on the surface of the template 32 to form the plurality of fully coated nanopores 36. In certain embodiments, the photosensitive material is a photoresist material. As will be appreciated, the photoresist material on exposure to activating radiation may require treatment with a developing solution to render the plurality of fully coated nanopores 36 wettable with a precursor solution.

Figure 7:
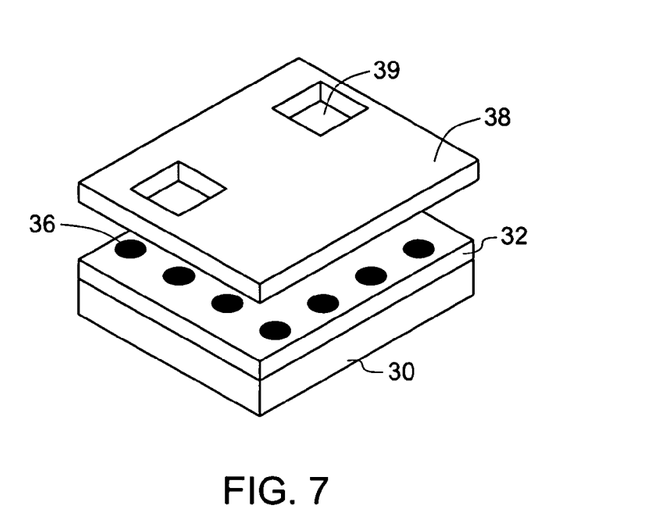

A patterned mask 38, such as shown in FIG. 7, is disposed on the template 32. In one non-limiting example, the patterned mask 38 is of a metal, such as, copper, nickel, stainless steel, molybdenum, tungsten or an alloy of these, although any other material that may be patterned may be used. The pattern of the patterned mask 38 include openings 39 corresponding to a future location of a nanostructure in the template 32. The openings 39 of the patterned mask 38 may have a defined dimension corresponding to the area of the template 32 that has to be exposed, and in one embodiment the dimension of the openings 39 is in a range of about 10 micrometers to about 10 centimeters (cm). Further, the openings 39 of the patterned mask 38 may be spaced at a distance from each other. In one embodiment, the spacing between the openings 39 is in a range of about 10 micrometers to about 10 cm. Further, the openings 39 of the patterned mask 38 may correspond to shapes such as, circles, squares, rectangles, or irregular shapes such as, distorted circles, distorted squares or distorted rectangles, for example. In one embodiment, a thickness of the patterned mask 38 is in a range of about 0.2 millimeter (mm) to about 1 mm.

The template 32 including the plurality of fully coated nanopores 36 may be exposed to an activating environment through the openings 39 in the patterned mask 38. The term "activating" as used herein corresponds to activation of the plurality of fully coated nanopores 36 such that the nanostructures may be formed within the plurality of fully coated nanopores 36. Exemplary activating environments include radiation. It is to be understood, that the "radiation" as used here includes, but is not limited to ultraviolet and/or visible wavelengths of the electromagnetic radiation spectrum. By exposing the template 32 to the activating radiation, through the openings 39 of the patterned mask 38, the masking material within the plurality of fully coated nanopores 36 underlying the openings 39 of the patterned mask 38 may degrade or degenerate. For example, a masking material comprising a hydrophobic material may become tolerable to hydrophilic material on exposure to activating radiation. Alternatively, the plurality of fully coated nanoparticles 36 may be activated through the openings 39 of the patterned mask 38 using other methods, for example, through chemical deactivation such as exposure to reactive gases such as ozone.

Figure 8:
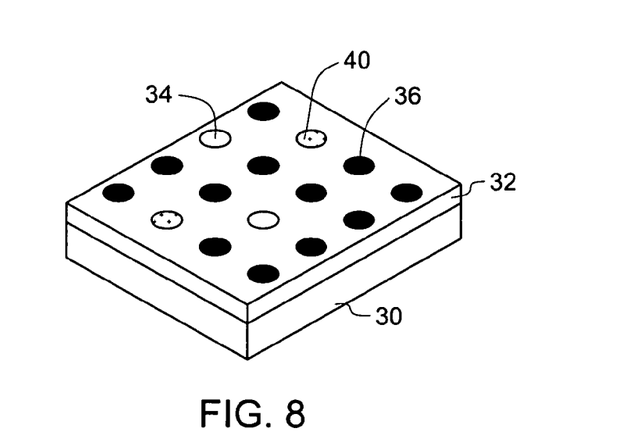

The patterned mask 38 is subsequently removed to expose the template 32 including a plurality of activated nanopores 40, as illustrated in FIG. 8. The formation of the activated nanopores 40 is not random since the position of the activated nanopores 40 in the template 32 corresponds to the openings 39 of the patterned mask 38.

Figure 9:
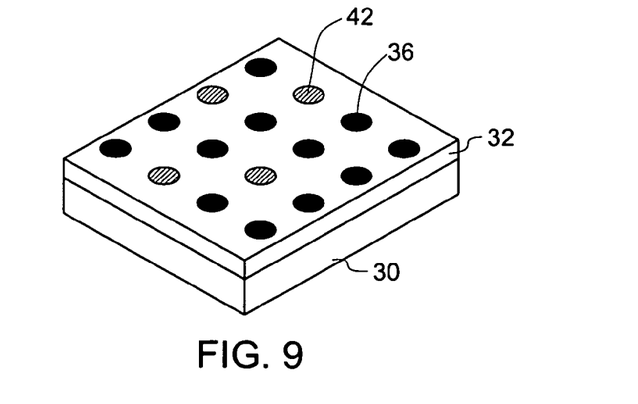

The plurality of nanostructures 42 may be formed within the plurality of activated nanopores 40, and the plurality of nanopores that are not-fully coated by the masking material, as shown in FIG. 9. The plurality of nanostructures 42 may be a nanoparticle, a nanowire, a nanorod, a nanotube, or any combinations thereof. The materials that may constitute the plurality of nanostructures 42 are similar to the materials described previously with respect to the plurality of nanostructures 18.

In one embodiment, the formation of the plurality of nanostructures 42 may be through electrodeposition, although other methods may be used. The electrodeposition method may involve exposing the template 32 to a precursor solution. The precursor solution may preferentially wet the plurality of activated nanopores 40 to form the plurality of nanostructures 42 within the plurality of activated nanopores 40.

According to embodiments of the invention, a distance or pitch between each of the plurality of nanostructures 42 may be controlled. One of the factors that may decide the pitch between each of the plurality of nanostructures 42 is the pattern of the patterned mask 38. In other words, by using the patterned mask 38 of desired pattern, a pitch between each of the plurality of nanostructures 42 may be controlled. Other exemplary factors that may affect the pitch have been described previously with respect to the previous embodiments. In some embodiments, the pitch between each of the plurality of nanostructures 42 is greater than about 1 micrometer. In certain embodiments, the pitch between each of the plurality of nanostructures 42 is in a range of about 1 micrometer to about 1000 micrometers. In certain other embodiments, the pitch between each of the plurality of nanostructures 42 is in a range of about 1 micrometer to about 100 micrometers.

Figure 10:
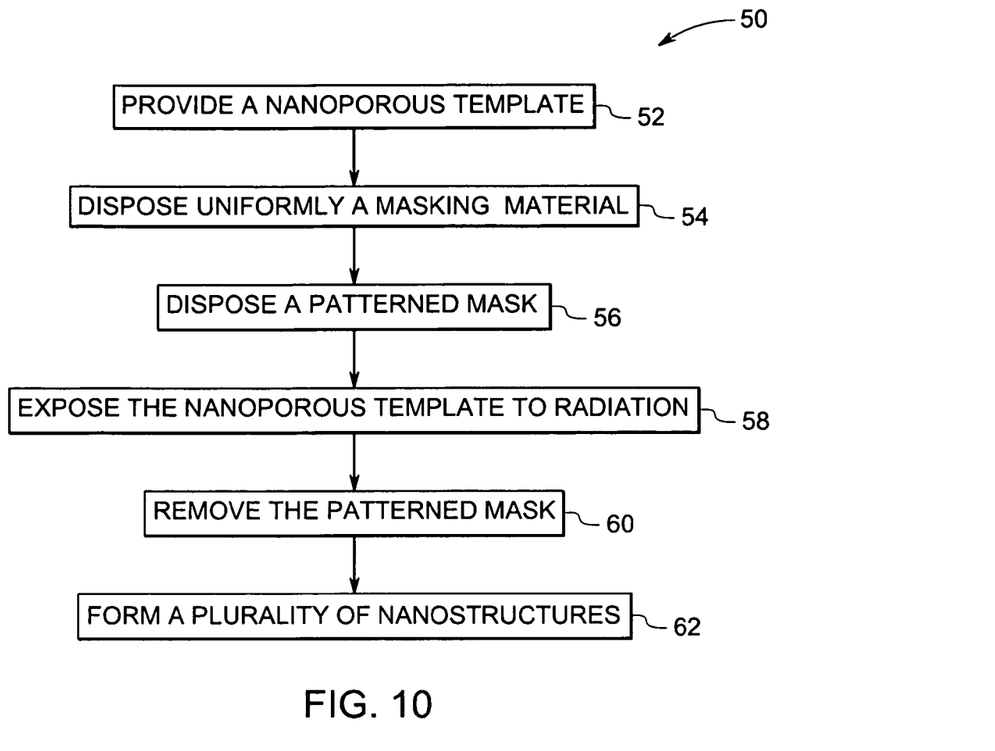
FIG. 10 is a flow chart illustrating a method of fabricating a nanostructure array, in accordance with embodiments of the present invention illustrated in FIGS. 5-9.

Turning now to FIG. 10, a flow chart 50 of the method of fabricating a nanostructure array in accordance with embodiments of FIGS. 5-9 is illustrated. A nanoporous template is provided at step 52. The nanoporous template includes a plurality of nanopores. A masking material is disposed in the plurality of nanopores, at step 54, to form a plurality of fully coated nanopores.

At step 56, a patterned mask may be disposed on the nanoporous template. The patterned mask may include openings corresponding to future positions of nanostructure and/or nanostructures in the template. The template is then exposed to activating radiation through the openings in the mask, at step 58. The activating radiation degrades the masking material coating the plurality of nanopores underlying the openings of the patterned mask to form a plurality of activated nanopores. At step 60, the patterned mask is removed to expose the template. A plurality of nanostructures is formed within the plurality of activated nanopores, and the plurality of nanopores that are not-fully coated by the masking material, at step 62. The formation of the nanostructures, in one embodiment, is through electrodeposition, although other methods may be used. Optionally, the template may be removed after the formation of the plurality of nanostructures to form a freestanding nanostructure array on the substrate. In one embodiment, the nanostructure is a nanorod. The nanorods, in one embodiment, have a diameter in the range of about 10 nanometers to about 200 nanometers and a height of about 20 nanometers to about 20 micrometers.

Nanostructure arrays fabricated using any of the embodiments of the present invention may find applications in various devices. For example, the disclosed techniques may be useful in fabricating field emitting devices. In a field emitting device, the nanostructure array having a large pitch between each of the plurality of nanostructures may be desirable to increase the field emission due to lowered screening effects resulting from the large pitch. Other example devices may include a thermoelectric device, a heat sink or any combination thereof.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE 1

This Example serves to illustrate the demonstrated fabrication of a nanorod array with a large pitch by selective activation of pores within a nanoporous anodic aluminum oxide template, in accordance with some embodiments of the present invention.

Preparation of octadecyl trichlorosilane treated anodic aluminum oxide: Anodic aluminum oxide (AAO) templates of 100 nm pores were prepared from commercially available antimony (Sb) doped silicon wafers (International Wafer Service) having a diameter of 100 mm and a low resistivity (0.005-0.020 ohm cm$^{-1}$). The silicon wafers were first cleaned in sulfuric acid for 15 minutes followed by treatment with 10% hydrofluoric acid for 1 minute. The silicon wafers were then rinsed with deionized water and dried. The silicon wafers were sputter etched for 2 minutes, and coated in a sputter coater (MRC 643A sputter coater), first with titanium tungstate (TiW) to a thickness of about 20 nm, and a second coating of gold (Au) to a thickness of about 50 nm. After the coating process, the wafers were removed from the coater and were cleaned with PRS 1000 (Baker) for 5 minutes. In a second sputter coating process, the silicon wafers were coated with titanium (6 nm) and aluminum (1000 nm).

The anodization of the wafers to form AAO wafers were carried out in 0.3 M oxalic acid ($C_2H_2O_4$, EM Science 99.5%) at a constant voltage of 40 V and a current of approximately 10 mA/cm$^2$, at room temperature (25° C.). Platinum gauze of 45 mesh woven from 0.198 mm diameter wire (Alfa Aesar) was used as the counter electrode during anodization. The anodization process required about 6 minutes per wafer. After anodization, the wafers were etched for approximately 15 seconds to 45 seconds in 80:1:1 solution of $H_2O:HF:H_2O_2$ to remove any residual titanium or aluminum oxide between the nanoporous AAO and the sputtered gold layer.

Three samples of functionalized AAO wafers were prepared by setting different conditions for the formation of each sample. Sample 1 was prepared by immersing the AAO wafer in 0.076 M methyl trichlorosilane (MTS) in toluene for 1 hour. Sample 2 was prepared by immersing the AAO wafer in 0.076 M octadecyl trichlorosilane (OTS) in toluene for 1 hour. Sample 3 was prepared by immersing the AAO wafer in 0.010 M octadecyl trichlorosilane in toluene for 1 hour. The three samples were then rinsed with copious amounts of toluene and were dried in air.

Platinum (Pt—NR) was electrodeposited in the three samples of functionalized nanoporous AAO wafers using a standard three electrode electrochemical cell to form nanorods within the nanopores. The electrolyte for electrodeposition was an electrolyte (Technic Platinum AP) with a platinum concentration of 1 gram per gallon (Technic, Inc., Cranston R.I.). The electrodes for the electrodeposition were a platinum gauze counter electrode and a 3 mm diameter 3 M silver/silver chloride (Ag/AgCl) reference electrode (CH Instruments, Austin Tex., model CHI111). A potentiostat was used to monitor the electrodeposition and to record the current-time data (CH Instruments, model 660B) during electrodepostion. Electrodeposition on the three samples of functionalized nanoporous AAO wafers were performed at a constant voltage of about 0.6 V with respect to the reference electrode, which produced a current of about 0.2 mA. The three electrodeposited samples were then copiously rinsed with deionized water and dried under a nitrogen gas stream.

The three electrodeposited samples were then fractured and mounted on an aluminum stub for scanning electron microscopy (SEM) analysis. The electrodeposited samples were examined in the SEM (LEO 1530VP FE-SEM) at 5 kV and 10 mm using the SE2 detector. Top view and cross-sectional view of the electrodeposited samples were recorded at a magnification of 10 kX and 25 kX, respectively. A number fraction of pores that were filled with the nanorods and an average pitch were computed for each sample from these images. The number fraction of pores that were filled with the nanorods was computed from the aerial view or top view of the SEM images of the samples. The average pitch was computed linearly from the cross-sectional view of the SEM images of the samples and is defined as the center-to-center spacing between the nanorods. Table 1 given below lists the number fraction of pores that were filled with the nanorods for each of the three samples.

TABLE 1

|  | number fraction | Average pitch |
| --- | --- | --- |
| Sample 1 | 0.0023 | 2.1 micrometers |
| Sample 2 | 0.0046 | 1.5 micrometers |
| Sample 3 | 0.0006 | 4.1 micrometers |

EXAMPLE 2

This example serves to illustrate the effect of UV irradiation in the fabrication of a nanorod array with large pitch, in accordance with some embodiments of the present invention.

Figure 11:
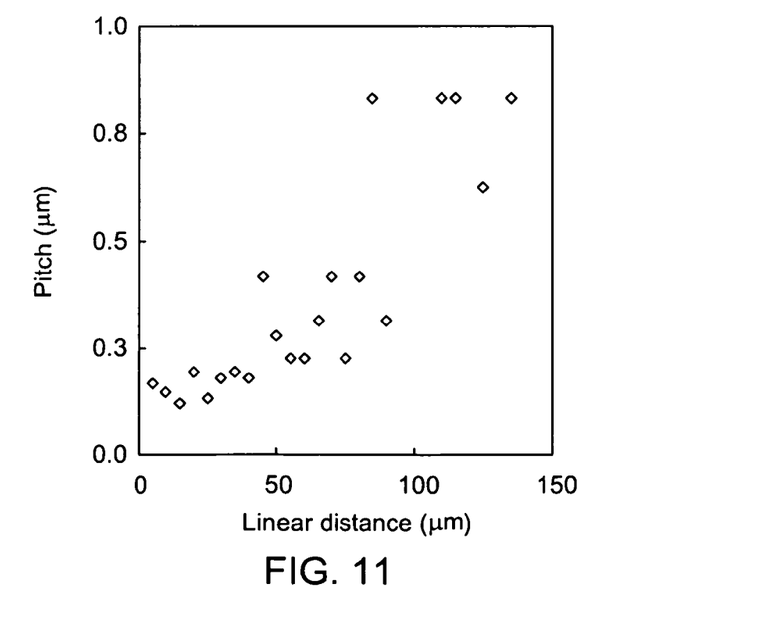
FIG. 11 is a plot of the pitch as a function of linear distance of the exposed region from the edge of the mask, according to embodiments of the present invention.

Preparation of UV-irradiated octadecyl trichlorosilane treated anodic aluminum oxide template: The AAO template was prepared as in Example 1. The template was then treated with 0.076 M octadecyl trichlorosilane in toluene for 10 minutes. The OTS coated template was then irradiated using ultraviolet (UV) radiation (UVP Mineralight, 254 nm) for 98 hours through a metal mask. The metal mask was positioned between the UV source and the template. Due to diffraction effects, a gradient in total UV exposure was present near the edges of the metal mask. FIG. 11 is a plot of the average pitch between the nanorods as a function of linear distance of the region exposed to radiation from the edge of the mask. The left hand side of the plot (i.e., a linear distance of 0) corresponds to a fully illuminated region that received a maximum UV dose. The pitch of the nanorods at a linear distance of zero is about 100 nm due to the high rate of irradiation. The right edge of the plot (i.e., a linear distance of 150 micrometers (μm)) corresponds to a fully masked region that received minimal UV dose. The pitch of the nanorods at the linear distance of 150 micrometers is an order of magnitude higher, and approaches a value of about 1.5 micrometer observed in Example 1.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making a nanostructure array comprising:
providing a template comprising a plurality of nanopores;
disposing a masking material on the template such that a first number of the plurality of nanopores are fully coated by the masking material and a second number of the plurality of nanopores are not-fully coated by the masking material; and
forming a plurality of nanostructures in only the second number of the plurality of nanopores.

2. The method of claim 1, wherein the template comprises anodic aluminum oxide, or titanium oxide, or porous silicon, or nanoporous glass, or track etched mica, or track etched polyester, or track etched polycarbonate, or track etched polymer, or any combinations thereof.

3. The method of claim 1, wherein disposing the masking material comprises disposing a hydrophobic material.

4. The method of claim 1, wherein disposing the masking material comprises disposing a photosensitive material.

5. The method of claim 1, wherein the masking material comprises silanes, or alkyl silane coated titania particles, or polymers, or thiols, or monosilanes, or trichlorosilanes, or octadecyl trichlorosilane, or dichlorosilanes, or monochlorosilanes, or trimethoxy silanes, or dimethoxysilanes, or monomethoxysilanes, or triethoxysilanes, or diethoxysilanes, or monoethoxysilanes, or alkylsilanes, or any combinations thereof.

6. The method of claim 1, wherein forming the plurality of nanostructures comprises electrodepositing a material in the second number of the plurality of nanopores.

7. The method of claim 1, wherein the plurality of nanostructures comprises nanorods, or nanotubes, or nanowires, or nanoparticles, or any combinations thereof.

8. The method of claim 1, wherein the plurality of nanostructures comprises metals, or semiconductors, or thermoelectric materials, or oxides, or carbides, or nitrides, or silicides, or conductive polymers, or any combinations thereof.

9. The method of claim 1, wherein a pitch between each of the plurality of nanostructures is in a range of about 1 micrometer to about 1000 micrometers.

10. The method of claim 1, further comprising:
disposing a patterned mask over the template, wherein the patterned mask includes a plurality of openings therethrough;
exposing the template to radiation through the openings in the patterned mask; and
removing the patterned mask after exposure to the radiation.

11. The method of claim 1, further comprises removing the template after forming the plurality of nanostructures.

12. A method of making a nanostructure away comprising:
providing a template comprising a plurality of nanopores;
disposing a masking material in only a portion of the plurality of nanopores to form a plurality of masked nanopores and a plurality of unmasked nanopores wherein a distribution of the plurality of masked nanopores and the plurality of unmasked nanopores is substantially random; and
forming a plurality of nanostructures in the plurality of unmasked nanopores.

13. The method of claim 12, wherein the template comprises anodic aluminum oxide, or titanium oxide, or porous silicon, or nanoporous glass, or track etched mica, or track etched polyester, or track etched polycarbonate, or track etched polymer, or any combinations thereof.

14. The method of claim 12, wherein the masking material comprises silanes, or alkyl silane coated titania particles, or polymers, or thiols, or monosilanes, or trichlorosilanes, or octadecyl trichlorosilane, or dichlorosilanes, or monochlorosilanes, or trimethoxy silanes, or dimethoxysilanes, or monomethoxysilanes, or triethoxysilanes, or diethoxysilanes, or monoethoxysilanes, or alkylsilanes, or any combinations thereof.

15. The method of claim 12, wherein forming the plurality of nanostructures comprises electrodepositing in the plurality of unmasked nanopores in presence of a precursor solution for a period of time, wherein the period of time is in a range of about 1 minute to about 48 hours.

16. The method of claim 12, wherein the plurality of nanostructures comprises metals, or semiconductors, or thermoelectric materials, or oxides, or carbides, or nitrides, or silicides, or conductive polymers, or any combinations thereof.

17. A method of making a nanostructure away comprising:
providing an anodic aluminum oxide template comprising a plurality of nanopores;
disposing a masking material on the anodic aluminum oxide template to form a plurality of masked nanopores and a plurality of unmasked nanopores, wherein the masking material comprise silanes; and
electrodepositing in the plurality of unmasked nanopores to form a plurality of nanostructures comprising a pitch.

18. The method of claim 17, wherein the pitch between each of the plurality of nanostructures is in a range of about 1 micrometer to about 100 micrometers.

* * * * *

UNITED STATES PATENT AND TRADEMARK OFFICE
CERTIFICATE OF CORRECTION

PATENT NO. : 7,488,671 B2
APPLICATION NO. : 11/441581
DATED : February 10, 2009
INVENTOR(S) : Corderman et al.

It is certified that error appears in the above-identified patent and that said Letters Patent is hereby corrected as shown below:

In Column 4, Line 67, delete "suicides," and insert -- silicides, --, therefor.

In Column 12, Line 7, in Claim 12, delete "away" and insert -- array --, therefor.

In Column 12, Line 39, in Claim 17, delete "away" and insert -- array --, therefor.

Signed and Sealed this

Twenty-fifth Day of August, 2009

David J. Kappos
*Director of the United States Patent and Trademark Office*